July 8, 1969 R. V. GOORDMAN 3,454,893
GATED DIFFERENTIAL AMPLIFIER
Filed Sept. 11, 1967

INVENTOR
R. V. GOORDMAN
BY
Charles Scott Phelan
ATTORNEY 3,454,893

GATED DIFFERENTIAL AMPLIFIER

Robert V. Goordman, Hackettstown, N.J., assignor to Bell Telephone Laboratories, Incorporated, Murray Hill, N.J., a corporation of New York Filed Sept. 11, 1967, Ser. No. 666,571
Int. Cl. H03f *3/68, 1/00, 21/00*
U.S. Cl. 330—30 6 Claims

ABSTRACT OF THE DISCLOSURE

In a gated emitter-coupled differential amplifier, a control transistor and a pair of diodes are interposed between a junction in the emitter circuit of the differential amplifier and its output terminals to suppress an output pedestal voltage which occurs in single-ended output signals of conventional gated differential amplifiers. The control transistor and the transistors of the differential amplifier may be of the same conductivity types or of complementary conductivity types.

BACKGROUND OF THE INVENTION

*Field of the invention*

The invention is a differential amplifier that is more particularly described as a combination of a differential amplifier and a switching circuit which controls the conduction state of the differential amplifier.

*Description of the prior art*

Conventional gated differential amplifiers, arranged for single-ended output, generally introduce an undesirable pedestal voltage, or two quiescent potential levels, into single-ended output signals. Since single-ended output signals of such a differential amplifier are produced between either of the collector terminals and ground, the quiescent potential of the single-ended output signals during each conduction state is determined by the quiescent current conducted through the collector circuits during those conduction states.

For instance, a conventional emitter-coupled differential amplifier may be gated ON and OFF by alternatively applying ON and OFF signals to an emitter current source of the differential amplifier for controlling the conduction state of the amplifier. When the ON signal is applied to the current source, such current source supplies the quiescent emitter current conducted by the differential amplifier. This quiescent emitter current is conducted through the differential amplifier into the collector output circuits where it determines for the ON state a first quiescent potential level upon which output signals are superimposed. When the OFF signal is applied to the emitter-current source, there is no current supplied by the current source to the emitter circuit; the transistors in the differential amplifier are cut off; and the potential on the collector electrodes rises to a second quiescent potential level that is approximately equal to the collector supply potential. The change of quiescent potential level, which occurs between either of the collector electrodes of the differential amplifier and ground reference when the amplifier changes from the conducting condition to the nonconducting condition or vice versa, determines a pedestal voltage in the single-ended output signals.

Such a pedestal voltage in output signals adversely affects the operation of load circuits which are connected between either of the output terminals and ground and which are designed to operate in response to output signals superimposed on a continuous uniform quiescent potential level rather than in response to output signals having two different quiescent potential levels.

SUMMARY OF THE INVENTION

An object of the invention is to suppress the pedestal voltage from the output circuits of a gated differential amplifier.

This and other objects of the invention are realized in an illustrative embodiment thereof in which a control transistor and a pair of diodes are interposed in an emitter-coupled differential amplifier stage. The emitter-collector path of the control transistor and the diodes form an alternate current routing path from an emitter circuit junction of the differential amplifier to separate output terminals of the differential amplifier. When the control transistor and the diodes are cut off, the amplifier conducts, or is ON; and when they conduct the differential amplifier does not conduct, or is OFF. While conducting, the control transistor and the diodes conduct all of the quiescent current otherwise conducted by the differential amplifier into the output circuits so that the quiescent potential level on the output terminals and the quiescent potential across load circuits is a continuous uniform level regardless of whether the differential amplifier is ON or OFF.

A feature of the invention is a control circuit that forms an alternate current routing path for suppressing the pedestal voltage from output circuits of a gated differential amplifier.

Another feature of the invention is the insertion of an emitter-collector path of a control transistor between a junction in the emitter circuit of the differential amplifier and a pair of diodes which respectively couple an output electrode of the control transistor to separate output terminals of the differential amplifier.

Another feature is controlling conduction of a differential amplifier by means of control signals applied to such a control transistor.

A further feature is the utilization of a control transistor of the same conductivity type as the transistors of the differential amplifier.

A still further feature is the utilization of a control transistor that is of an opposite conductivity type from the transistors of the differential amplifier.

BRIEF DESCRIPTION OF THE DRAWINGS

A better understanding of the invention may be derived from the detailed description following, if that description is considered with respect to the attached drawing in which.

DETAILED DESCRIPTION

Figure 1:
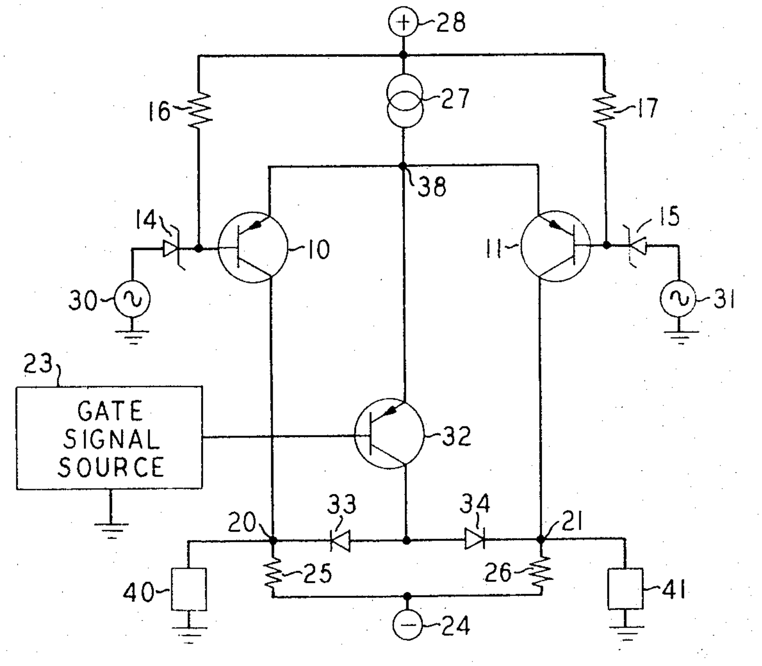
FIG. 1 is a schematic diagram of an embodiment of the invention.

Referring now to FIG. 1, there is shown an emitter-coupled differential amplifier including PNP transistors 10 and 11, which produce single-ended output signals at output terminals 20 and 21. The single-ended output signals are produced without a pedestal voltage when the amplifier is gated ON and OFF in response to signals from a grounded gate-signal source 23. Collector supply potential from a grounded negative-potential source 24 is coupled respectively by way of resistors 25 and 26 to the collector electrodes of the transistors 10 and 11. An emitter-current source 27 supplies emitter current from a grounded positive-potential source 28 to the differential amplifier. Input signals, which may include both differential-mode and common-mode components, are generated by grounded signal sources 30 and 31 and are coupled respectively through reverse breakdown diodes 14 and 15 to the base electrodes of the transistors 10 and 11. A resistor 16, which couples the source 28 to the base electrode of the transistor 10, and the reverse breakdown diode 14 establish on that base electrode a quiescent potential that is positive with respect to the quiescent potential on the terminal 20. Likewise, a resistor 17, which couples the source 28 to the base electrode of the transistor 11, and the reverse breakdown diode 15 establish on that base electrode a quiescent potential that is positive with respect to the quiescent potential on the terminal 21. The transistors 10 and 11 are thereby biased to conduct in the linear region of their characteristic curves when the differential amplifier is turned ON.

Figure 2:
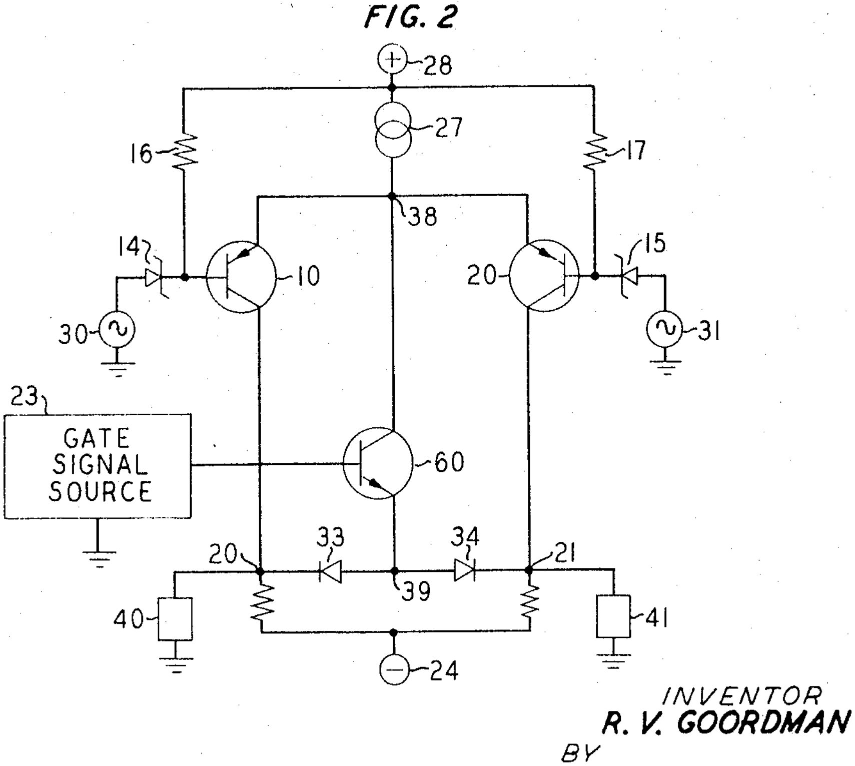
FIG. 2 is a schematic diagram of another embodiment of the invention.

Each potential source, shown in FIG. 1 and in FIG. 2 of the specification, is shown as a circle enclosing either a positive or negative polarity symbol. The polarity symbol indicates that the potential source terminal having the polarity shown is connected to the indicated point in the diagram and that the potential source terminal of opposite polarity is connected to ground. The potentials of the sources 24 and 28 can be selected so that the quiescent potentials on the terminals 20 and 21 are essentially at ground.

An emitter-collector path of a PNP transistor 32 and a pair of diodes 33 and 34 couple an emitter-circuit junction 38 of the differential amplifier to its output terminals 20 and 21, which are connected respectively to the collector electrodes of the transistors 10 and 11. The emitter and collector electrodes of the transistor 32 are connected respectively to the junction 38 and to the anodes of the diodes 33 and 34. The diode 33 couples the collector electrode of the transistor 32 to the terminal 20 and therefore to the collector electrode of the transistor 10. The diode 34 couples the collector electrode of the transistor 32 to the terminal 21 and therefore to the collector electrode of the transistor 11. The gate-signal source 23 applies control signals to the base electrode of the transistor 32 for controlling conduction through the emitter-collector path of the transistor 32 and thereby controlling the conduction state of the differential amplifier.

The arrangement of the transistors 10 and 11 and the current source 27 operates as a conventional differential amplifier whenever the differential amplifier is turned ON. Such differential amplifier is turned ON whenever a positive potential with respect to the potential on junction 38 is applied by the gate-signal source 23 to the base electrode of the transistor 32 so that the transistor 32 and the diodes 33 and 34 are cut off. The emitter-current source 27 supplies the total emitter current including the quiescent current required by the conducting transistors 10 and 11. In accordance with conventional differential amplifier operation, the potential on the junction 38 is essentially constant. Because the transistor 32 and the diodes 33 and 34 are cut off, the diodes 33 and 34 provide a high impedance path between the output terminals 20 and 21. This high impedance has negligible effect on the conventional operation of the differential amplifier. Single-ended output signals are produced between both of the terminals 20 and 21 and ground reference in response to input signals applied by the signal sources 30 and 31. Load circuits 40 and 41 are respectively coupled between the terminals 20 and 21 and ground so that the load circuits respond to the single-ended output signals.

The differential amplifier is cut off, or is in its OFF state, when a sufficiently large potential that is negative with respect to the potential on the junction 38 is applied by the gate-signal source 23 to the base electrode of the transistor 32. At such a time, the transistor 32 and the diodes 33 and 34 conduct, and the transistors 10 and 11 are cut off. The transistor 32 and the diodes 33 and 34 form an alternate current route which conducts the quiescent current, used by the differential amplifier during its ON state, from the emitter-current source 27 into the output circuits of the differential amplifier during the OFF state. This conduction through the transistor 32 and the diodes 33 and 34 continues until the control signal from the gate-signal source 23 returns to a potential more positive than the potential on the junction 38, thereby turning off the transistor 32.

Since the transistor 32 and the diodes 33 and 34 are arranged so that they are cut off when the differential amplifier is in its ON state and so that they conduct all of the quiescent emitter current of the differential amplifier when it is in its OFF state, an essentially uniform quiescent current is always coupled from the emitter-current source 27 into the output circuits of the differential amplifier either through the transistors 10 and 11 or through transistor 32 and the diodes 33 and 34. By applying Ohm's law, it can be shown that the quiescent potentials on the output terminals 20 and 21 retain uniform levels as the differential amplifier is turned ON or OFF because the impedance of the output circuits and the quiescent currents through the output circuits are essentially uniform regardless of the changes of state of the differential amplifier.

The diodes 33 and 34 additionally provide a current path between the terminals 20 and 21 during periods of transition between the ON and OFF states and vice versa. While the diodes 33 and 34 are conducting, their impedance is substantially smaller than the impedance of the ouput circuits. During these transistion periods, differential-mode output signals on the terminals 20 and 21 tend to cancel one another through the low impedance path of the diodes 33 and 34 because the magnitudes of such differential-mode signals on the terminals 20 and 21 are equal and the phases of such signals are opposed. Since the differential-mode signals cancel one another through the diodes 33 and 34 during periods of transition, single-ended output siynals are reduced during such periods.

Even though the differential amplifier changes between its ON and OFF states, single-ended output signals across the loads 40 and 41 are superimposed on a relatively uniform quiescent potential level rather than being superimposed on one of two different quiescent potential levels included in the pedestal voltage signals from prior art circuits. The uniform quiescent potential level of the single-ended output signals form the embodiment of FIG. 1 occurs because the quiescent current coupled into the output circuit is relatively uniform regardless of whether the differentail amplifier is ON or is OFF or is making a transition between those states. The terminals 20 and 21 are therefore held at a relatively uniform potential all of the time except when the differential amplifier is ON and input signals having a potential other than ground potential are applied by the sources 30 and 31.

Referring now to FIG. 2, there is shown another embodiment of a gated differential amplifier that is similar to the amplifier shown in FIG. 1 except that an NPN transistor 60, shown in FIG. 2, replaces the PNP transistor 32, shown in FIG. 1. Replacing the PNP transistor 32 with the NPN transistor 60 requires interchanging the transistor connections so that the collector electrode and the emitter electrode of the transistor 60 are respectively connected to the junction 38 and to a junction 39 between the anodes of the diodes 33 and 34.

In operation of the embodiment of FIG. 2, the differential amplifier is turned on for conventional operation when a signal of negative polarity with respect to the potential on the junction 39 between the diodes 33 and 34 is applied by the grounded gate-signal source 23 to the base electrode of the transistor 60. The transistor 60 and the diodes 33 and 34 are thereby cut off and have no effect on conventional operation of the differential amplifier. The transistors 10 and 20 conduct the total emitter current including both quiescent current and signal current components supplied by the emitter-current source 27 to the differential amplifier.

The differential amplifier is turned off when a sufficiently large potential that is positive with respect to the potential on the junction 39 is applied by the gate-signal source 23 to the base electrode of the transistor 60. Transistor 60 and the diodes 33 and 34 are thereby biased to conduct and provide an alternate route for the quiescent current from the current source 27. This quiescent current is conducted through the collector-emitter path of transistor 60 and the diodes 33 and 34 into the output circuits of the differential amplifier in a manner similar to the operation of the embodiment of FIG. 1. The diodes 33 and 34 provide a low impedance path between the terminals 20 and 21 during transition periods between the states of the differential amplifier. Therefore, as in the operation of the embodiment of FIG. 1, the quiescent curren supplied to the output circuits is relatively uniform for the ON state, the OFF state, and the transition periods of the differential amplifier; and essentially no pedestal voltage occurs on the terminals 20 and 21 as a result of gating the differential amplifier ON and OFF. Since the quiescent potential on the terminals 20 and 21 is relatively uniform, single-ended output signals, which are impressed across the loads 40 and 41 when the differential amplifier changes from its ON state to its OFF state or vice versa, are superimposed on a relatively uniform quiescent potential level rather than being superimposed on one of two different quiescent potential levels included in the pedestal voltage signals from prior art circuits.

The above detailed description is illustrative of two embodiments of the invention and it is to be understood that additional embodiments thereof will be obvious to those skilled in the art. The embodiments described herein together with those additional embodiments are considered to be within the scope of the invention.

What is claimed is:

1. A circuit comprising a differential amplifier coupling a current source to an output circuit, a gate signal source, and a pedestal voltage suppressing means responsive to gating signals from the gate source for providing a selectable alternate current route between the current source and the output circuit.

2. In combination, a differential amplifier coupling a current source to an output circuit, a control signal source producing first and second signal levels, and alternate current routing means coupling the current source to the output circuit, the alternate current routing means being cut off in response to the first signal level and conducting current from the current source to the output circuit in response to the second signal level.

3. An emitter-coupled differential amplifier including first and second output terminals and an emitter circuit junction, the amplifier comprising: a control transistor having first and second output electrodes, means coupling the first output electrode of the control transistor to the emitter circuit junction, a first diode poled for forward conduction coupling the second output electrode of the control transistor to the first output terminal, and a second diode poled for forward conduction coupling the second output electrode of the control transistor to the second output terminal.

4. An amplifier in accordance wtih claim 3 further comprising: a gate signal source coupled to a base electrode of the control transistor, means applying differential-mode signals to input terminals of the differential amplifier, and supply means coupled to the first and second output terminals for supplying bias potential to a pair of transistors in the differential amplifier and to the control transistor whereby each transistor operates in a linear region of its conduction characteristc during prescribed periods of conduction determined by signals from the gate source.

5. An amplifier in accordance with claim 3 in which the differential amplifier comprises a pair of transistors of the same conductivity type as the control transistor.

6. An amplifier in accordance with claim 3 in which the differential amplifier comprises a pair of transistors of opposite conductivity type from the control transistor.

References Cited

UNITED STATES PATENTS 3,330,972 7/1967 Malan ------------ 330—69 X

JOHN KOMINSKI, *Primary Examiner.*

LAURENCE J. DAHL, *Assistant Examiner.*

U.S. Cl. X.R.

307—239; 330—69